United States Patent [19]

Leach et al.

[11] Patent Number: 5,036,321

[45] Date of Patent: Jul. 30, 1991

[54] CAPACITIVE SENSING, SOLID STATE TOUCH BUTTON SYSTEM

[75] Inventors: Robert B. Leach, New Britain; Chester J. Slabinski, New Hartford; Jean Youla, Hartford, all of Conn.

[73] Assignee: Otis Elevator Company, Farmington, Conn.

[21] Appl. No.: 401,363

[22] Filed: Aug. 31, 1989

[51] Int. Cl.$^5$ .......................................... H03K 17/955
[52] U.S. Cl. ........................................ 341/33; 341/24
[58] Field of Search ..................... 341/33, 22, 24, 26; 340/711; 324/684

[56] References Cited

U.S. PATENT DOCUMENTS

| | | | |
|---|---|---|---|
| 4,007,459 | 2/1977 | Hagelbarger | 341/26 |
| 4,145,748 | 3/1979 | Eichelberger et al. | 341/33 |
| 4,237,421 | 12/1980 | Waldron | 341/33 |
| 4,305,135 | 12/1981 | Dahl et al. | 341/33 |
| 4,543,564 | 9/1985 | Audoin et al. | 341/24 |
| 4,728,931 | 3/1988 | Linder et al. | 341/33 |
| 4,728,932 | 3/1988 | Atherton | 341/33 |
| 4,737,768 | 4/1988 | Lewiner et al. | 341/33 |
| 4,772,874 | 9/1988 | Hasegawa | 341/33 |

OTHER PUBLICATIONS

J. G. Irwin, Jr., "Dynamically Adjustable Capacitive Key Sensing Method", Jan. 1983, IBM Technical Disclosure Bulletin, p. 4097.

*Primary Examiner*—Donald J. Yusko
*Assistant Examiner*—Yuk H. Lau

[57] ABSTRACT

A solid state touch or control button assembly (10), with no moving button parts and operated by capacitive sensing by monitoring the phase shift of a signal applied to the face of the button, including in a first embodiment (FIGS. 2A & 2B) a auto balancing button and in a second embodiment (FIGS. 3A & 3B) a constant pressure button. If skin or other material comes into contact with the touch surface, the capacitance is changed and sensed, causing the electrical or electronic function controlled by the touch button to be activated (or deactivated, depending on the design, or otherwise altered). LEDs then are activated, providing visual feedback to the button pusher through a light ring (2A) surrounding the button surface (1). False activation of the button by residual impedance and external influences, such as temperature change, cleaner residue build-up and other deposits, are avoided by compensating for them by slowly auto balancing to all such phase shifts, with the rate of auto balance being set to be faster than the rate of change of the steady state phase shift; and, additionally, false activations by noise transients, including those due to EMI, FRI and other environmental fluctuations, are avoided by delaying the activation of the button by an appropriate amount of time, such as, for example, of the order of about one hundred (100 msec.) milliseconds.

7 Claims, 9 Drawing Sheets

| FIG. 2A(a) |
| FIG. 2A(b) |

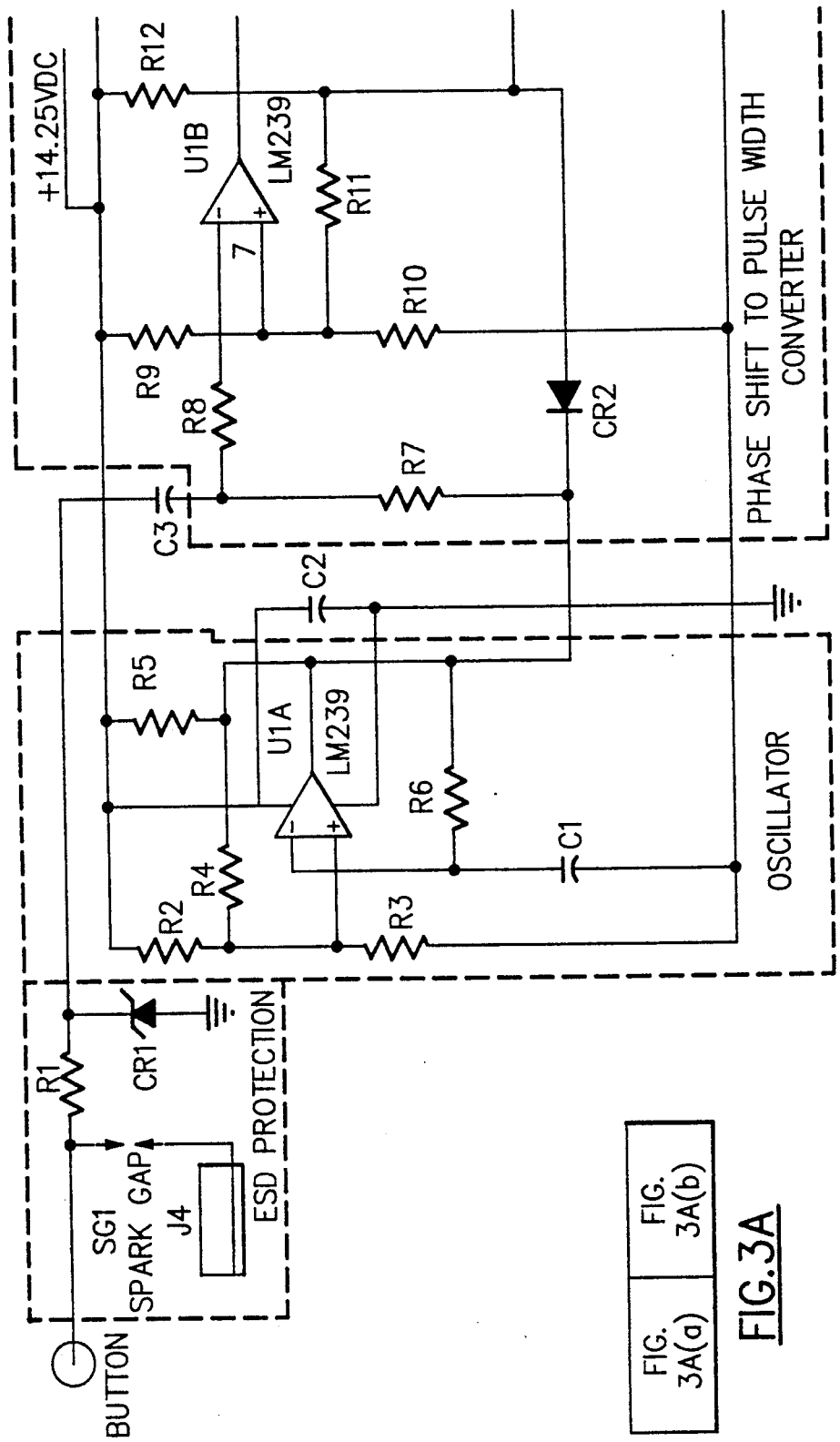

CAPACITIVE SENSING, SOLID STATE TOUCH BUTTON SYSTEM

TECHNICAL FIELD

The present invention relates to touch buttons typically used to activate or deactivate or otherwise control some electrical or electronic function, such as signaling, when touched typically by a human operator touching or "pushing" on the button with a finger. The invention more particularly relates to a solid state touch button system with no moving parts operated by capacitive sensing, which can be used in many different applications, including, for example, as a touch or push button for elevator car calling or control.

BACKGROUND ART

There is a need for a reliable button that does not use or need moving parts or mechanical contacts, to be used in, for example, elevator applications. It is desirable that such a button be aesthetically pleasing in appearance and use, highly reliable, low in cost and not be activated by extreme environmental changes.

It is known that the human body has some amount of capacitance to ground. A basic, previously known concept or approach is to monitor a button face for capacitance to ground, and, if a certain amount (or greater) capacitance is present, to activate the button.

In the present invention, this monitoring of the button surface is accomplished by monitoring the phase shift of a signal applied to the face of the button.

However, due to the residual impedance of the button and the presence of external influences, the steady state phase shift of the button can fluctuate. Such external influences include, for example, temperature changes, cleaner residue build-up and other deposits or extreme environmental changes, etc. This fluctuation has the potential to falsely activate a button, which is based on the monitoring of phase shift, although in fact no human operator is touching the button.

A distinguishing characteristic of such exemplary fluctuation is that it would occur slowly over a period of time relative to a phase shift induced by the presence of a person. To avoid this problem, in a first "auto-balancing" embodiment of the invention the steady state phase shift fluctuation is compensated for by slowly auto balancing to all phase shifts The rate of auto balance is set to be faster than the rate of change of the steady state phase shift. The rate of change of phase shifts induced by a person is faster than the auto balance rate, which allows the button to be operated. In a second, "constant pressure" embodiment, another way to compensate for the exemplary fluctuations is to simply set a threshold for activation higher than any normal fluctuations.

A second potential source of false activations of such a button are phase shifts induced by transient noise. These potential transients include, for example, electromagnetic interference (EMI) and radio frequency interference (RFI).

A distinguishing characteristic used in the invention to help prevent false activations caused by transient noise is that such noise would not last for a long period of time relative to the interaction time with a person. Activations due to transient noise thus are avoided in the invention by delaying the activation of the button for a certain minimum period of time.

DISCLOSURE OF INVENTION

Thus the present invention is directed to a reliable button that does not need, and preferably does not use, any moving parts or mechanical contacts and can be used in, for example, elevator applications.

Additionally, the present invention is directed to a button that is aesthetically pleasing in appearance and use, highly reliable, is low in cost and is not activated by extreme environmental changes.

Finally and most importantly, the present invention is directed to a phase shift monitoring, capacitive sensing button that avoids false activation of the button by residual impedance and external influences, such as temperature change, cleaner residue build-up and other deposits. The "auto-balancing" embodiment of the invention achieves this by compensating for them by slowly auto balancing to all such phase shifts, with the rate of auto balance being set to be faster than the rate of change of the steady state phase shift; while the "constant pressure" embodiment achieves it by compensating for the exemplary fluctuations by simply setting a threshold for activation higher than any normal fluctuations. Additionally, the present invention avoids false activations by noise transients, including those due to EMI and RFI by delaying the activation of the button, and the associated operative signal that causes it to be activated, by an appropriate amount of time, such as, for example, a time period of the order of about one hundred (100 msec.) milliseconds.

In the exemplary "auto balancing" embodiment, three integrators are used to provide the auto balancing feature of the invention. A "medium" speed integrator provides a "trigger" signal, while relatively "slow" and "fast" integrators provide "set" and "reset" thresholds.

In accordance with another aspect of the invention, the purpose of the delay on the timer is for erroneous signal rejection, as generally mentioned above. The erroneous signals of primary concern are those which could be caused by extreme environmental changes. Testing has shown that any set pulses caused by exemplary, extreme environmental changes typically do not last longer than one hundred (100 msec.) milliseconds with an input resistance of, for example, one (1 M$\Omega$) megohms.

Further testing with the input resistor set to, for example, two hundred and sixty-one (261 k$\Omega$) kilo-ohms resulted without any set pulses caused by extreme environmental conditions. From these results a delay "on" time of the order of about one hundred (100) milliseconds is deemed to be appropriate.

In the exemplary "auto balance" embodiment the delay time is achieved by a set pulse charging a capacitor through resistors and a diode to a threshold set by other resistors. The voltage across the charging capacitor will reach the threshold, if a set pulse or series of set pulses transpire without the occurrence of any "reset" pulses.

Once the threshold is reached, the output of a comparator is released from common. The voltage on the charging capacitor is pulled up and held high by a hysteresis resistor, pending the occurrence of a "reset" pulse.

At any time the voltage across the charging capacitor can be quickly discharged by a "reset" pulse. The voltage across the charging capacitor is discharged through a current limiting resistor, which resets the timer.

Benefits of the invention include the facts that the button is:
- heat resistant;
- EMI resistant;
- RFI resistant;
- ESD resistant; and is capable of providing light and/or other feedback.

The invention may be practiced in a wide variety of applications, including but not restricted to, elevator car call or control buttons, utilizing known technology, in the light of the teachings of the invention, which are discussed in detail hereafter.

Other features and advantages will be apparent from the specification and claims and from the accompanying drawings, which illustrate two exemplary embodiments of the invention, an auto-balancing embodiment and a constant pressure embodiment.

BRIEF DESCRIPTION OF DRAWINGS

FIGS. 2A & 2 interconnected schematic diagrams of an exemplary circuit for the button system of the present invention with auto balancing characteristics, with the two schematics being connected in the "Delay On Timer" at the "SET/RESET" line; while

DESCRIPTION OF THE PREFERRED EMBODIMENT

BUTTON ASSEMBLY (10)

Figure 1:
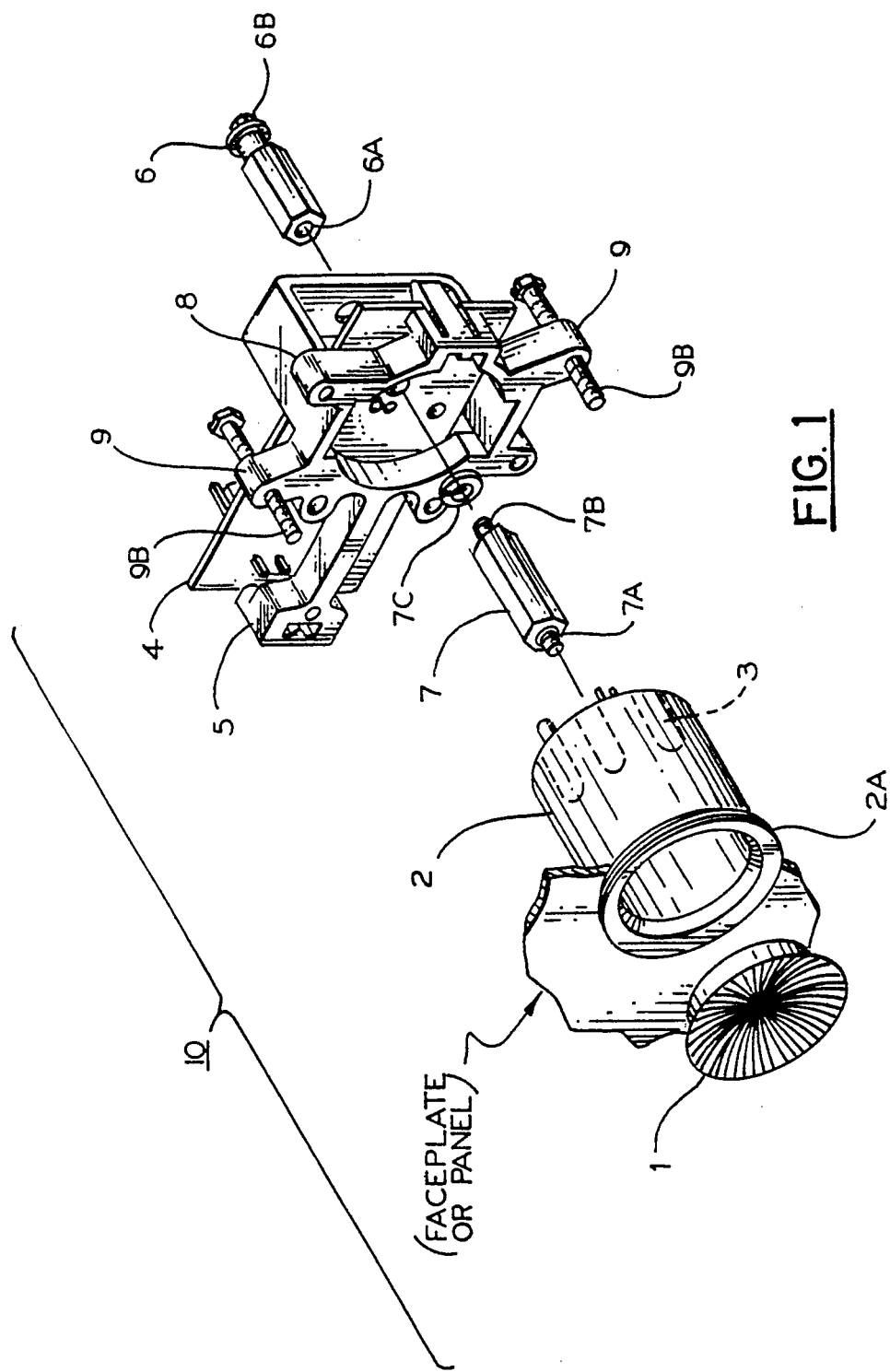
FIG. 1 is an exploded, perspective view of an exemplary solid state push button, including the button, light ring, printed circuit (PC) board and holder for attaching the PC board to the push button elements and the overall button assembly to a face plate or panel, with the PC board carrying the electrical components which form the exemplary electronics and circuitry of the present invention. (It is noted that the touch button elements of FIG. 1 are basically symmetrical about their longitudinal center-line, except for the PC board and its associated holder.)

As can be seen in FIG. 1, the exemplary "solid state button" (SSB) 10 of the present invention preferably includes a non-moving, capacitive sensing button surface 1, that can be used, for example, as a call button in the car operating panel (COP) and/or hall fixtures of an elevator system. The SSB is capable of capacitively sensing a human touch, preferably providing both visual feed back (illumination) to the button pusher, as well as communication to the operational control of the elevator system through, for example, a remote station interface that the button has been actuated, so that the system accordingly can react.

The exemplary button of FIG. 1 includes the non-moving button element 1 fitted within a light ring element 2, in which ring is carried a circular array of light emitting diodes (LEDs) 3 at its bottom. A printed circuit board 4, into which the light ring element 2 is pin inserted, is carried on the back side of the button elements 1, 2, and is held to the button elements by a bracket 5 and rear bolt 6.

The interconnecting bolt or stem 7 has a front, threaded, male end 7A, which is screwed into the back side of the button surface 1, and a rear, threaded, male end 7B, which is screwed into the front end 6A of the rear bolt 6 with a lock washer 7C. The interconnecting bolt 7 extends through a center, circular opening (unseen) in the light ring element 2 and through an opening in the PC board 4, while the head 6B of the rear bolt 6 fits into a notch in a "U'8 shaped rear strap 8, which is part of the bracket holder 5. When assembled, the intermediate elements of the button assembly 10 are held in compression between the button surface 1 and the head 6B of the bolt 6.

The bracket 5 includes a series of peripherally spaced, lateral extensions 9 through which screw pins 9B are placed for fastening the button assembly 10 to a face plate or panel. When so fastened, the only elements of the button assembly 10 which are seen by the user is the non-moving, circular button surface 1 surrounded by the translucent ring 2A, which is illuminated up by the internally contained LEDs when the button is actuated.

The printed circuit board 4 carries on it the electronic components and circuitry which perform the SSB monitoring functions of the present invention.

Figure 2A:
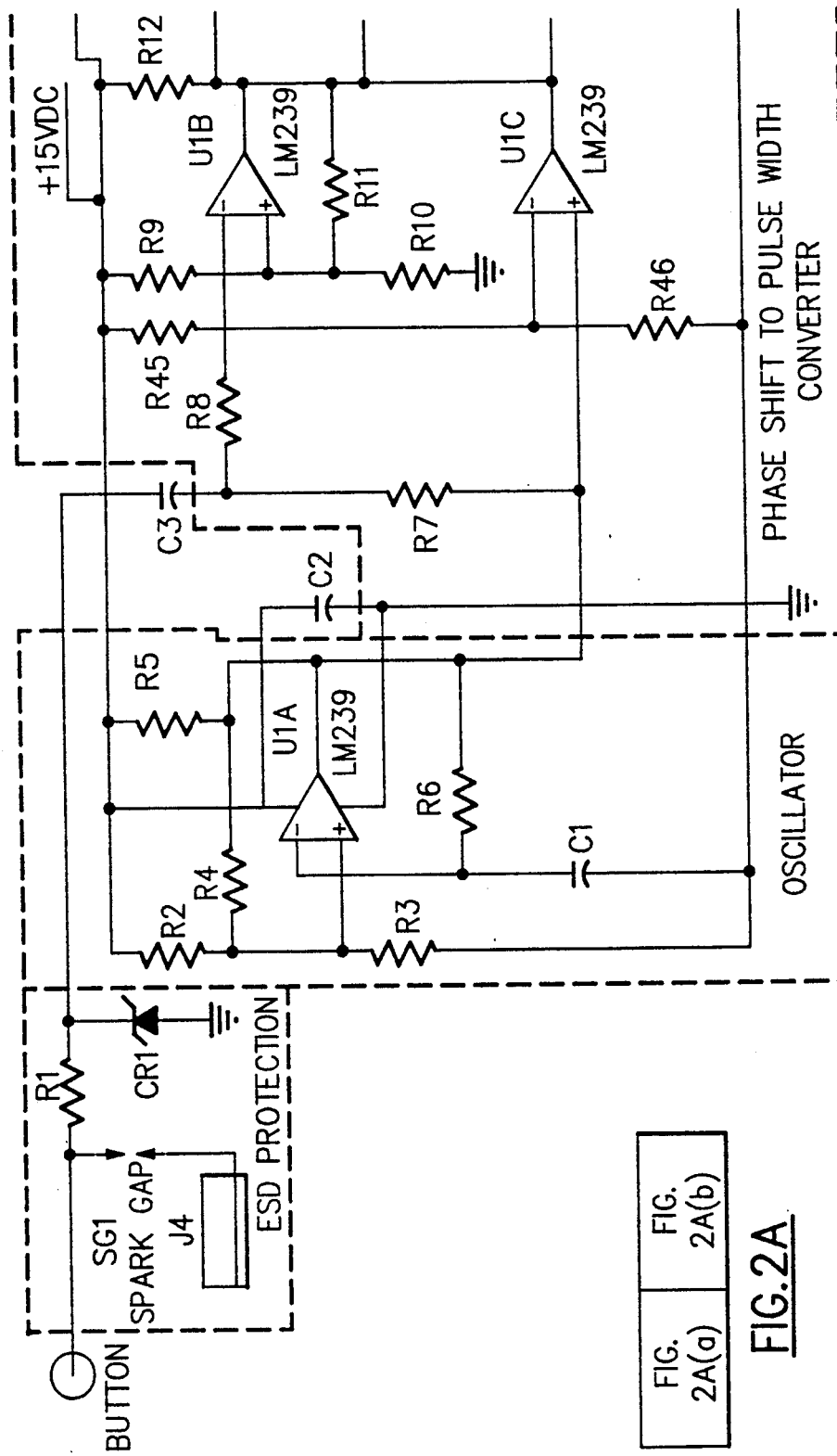
Figure 2A:
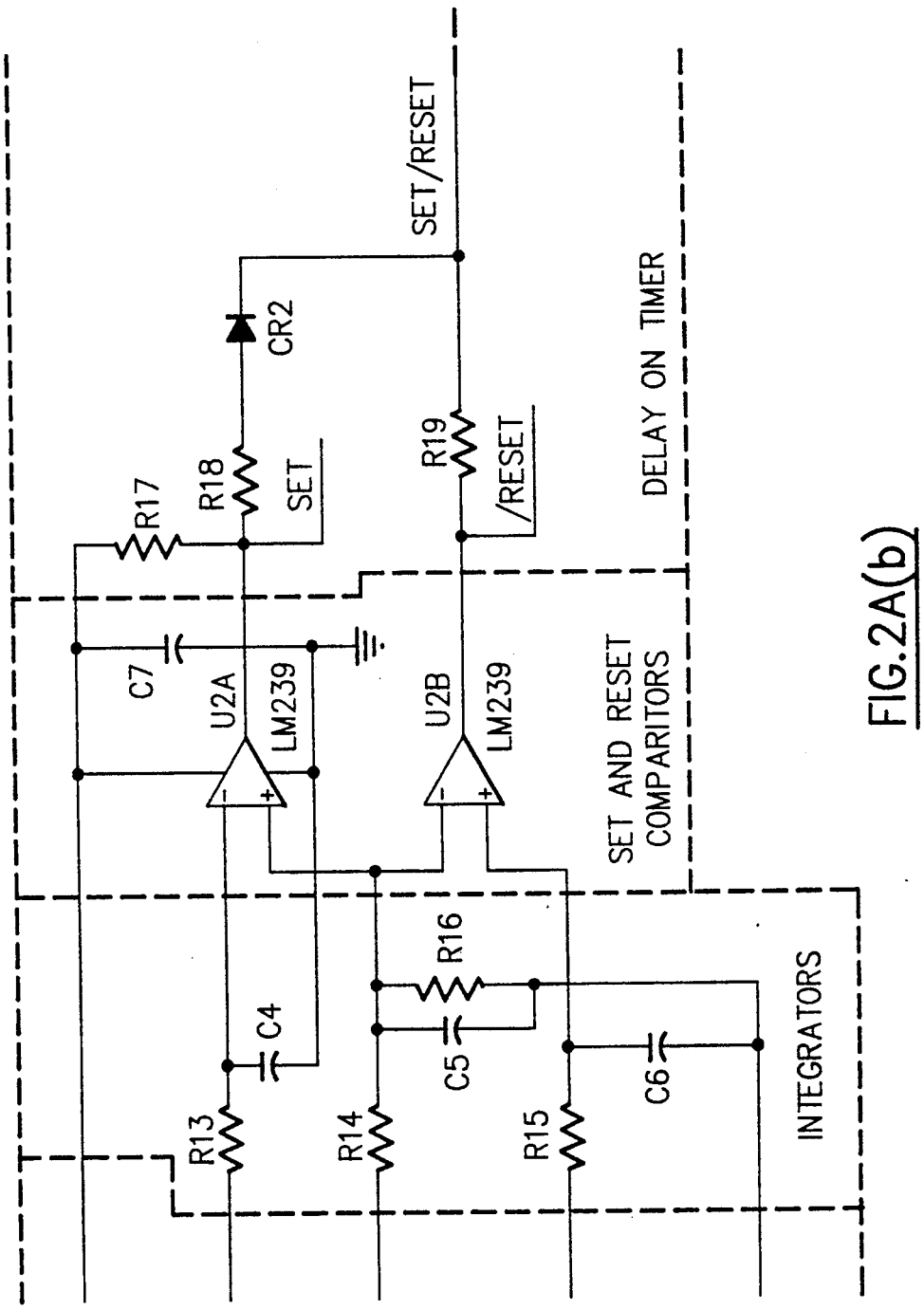
Figure 2B:
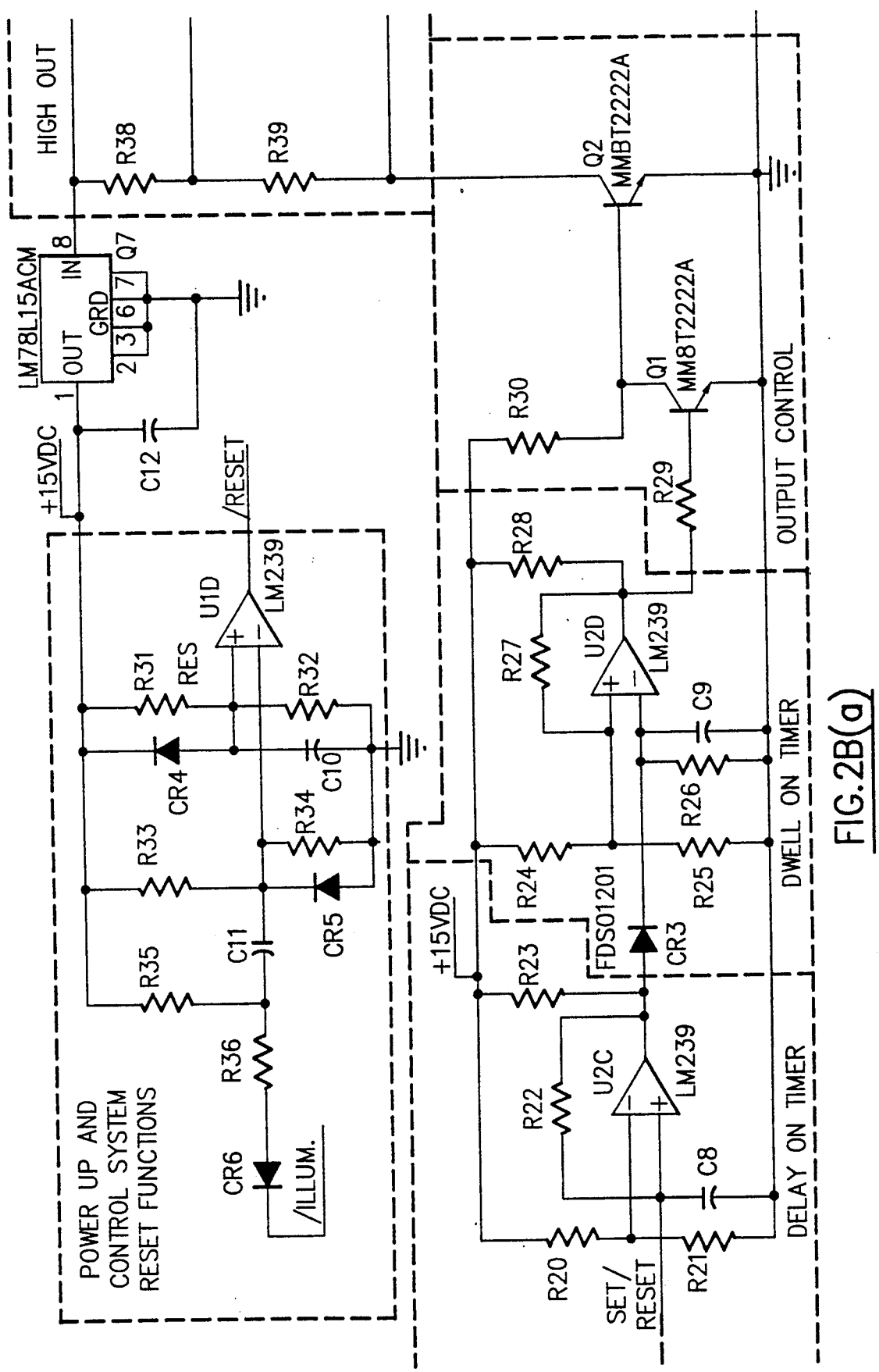
Figure 2B:
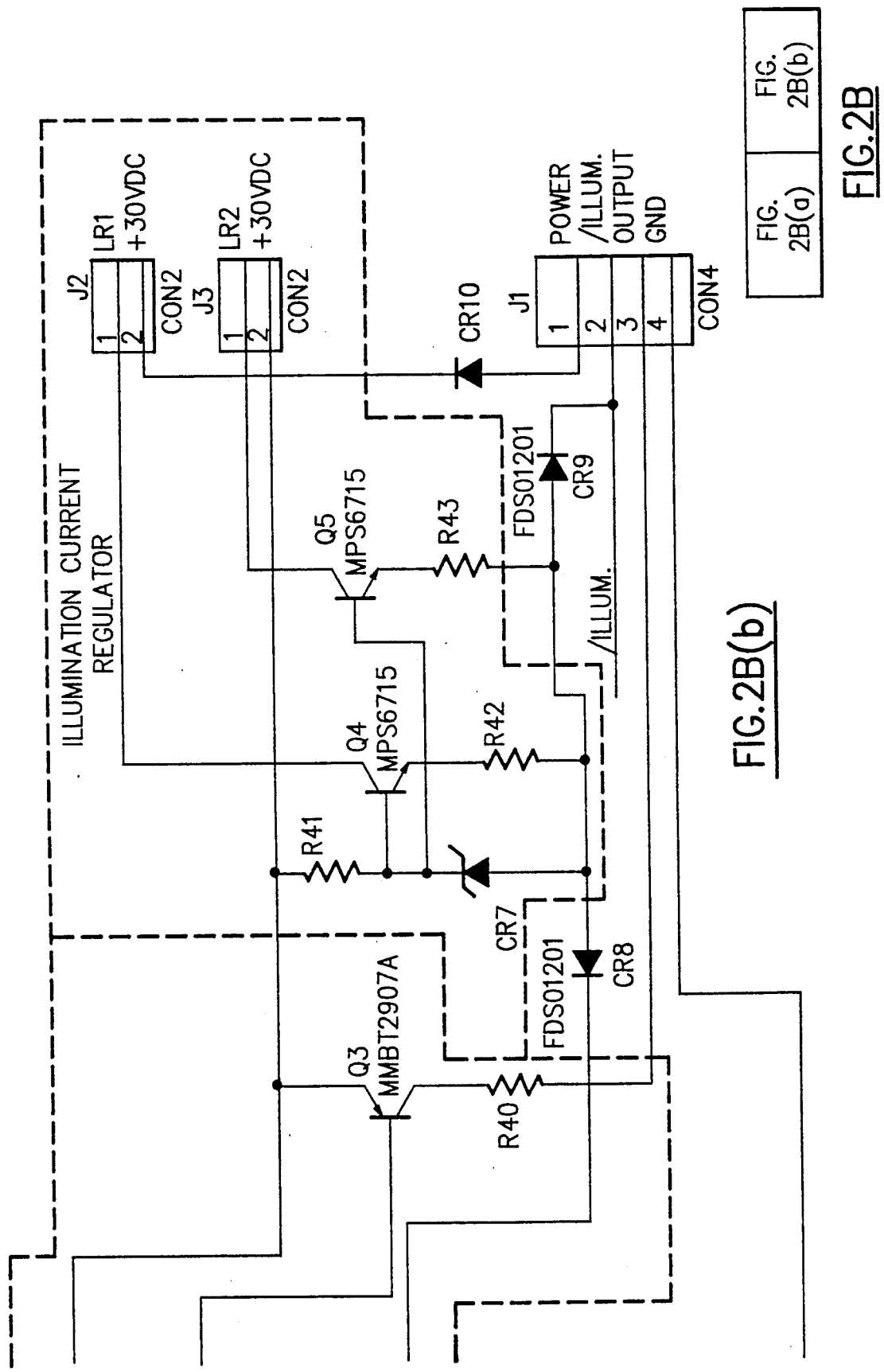
Figure 3A:
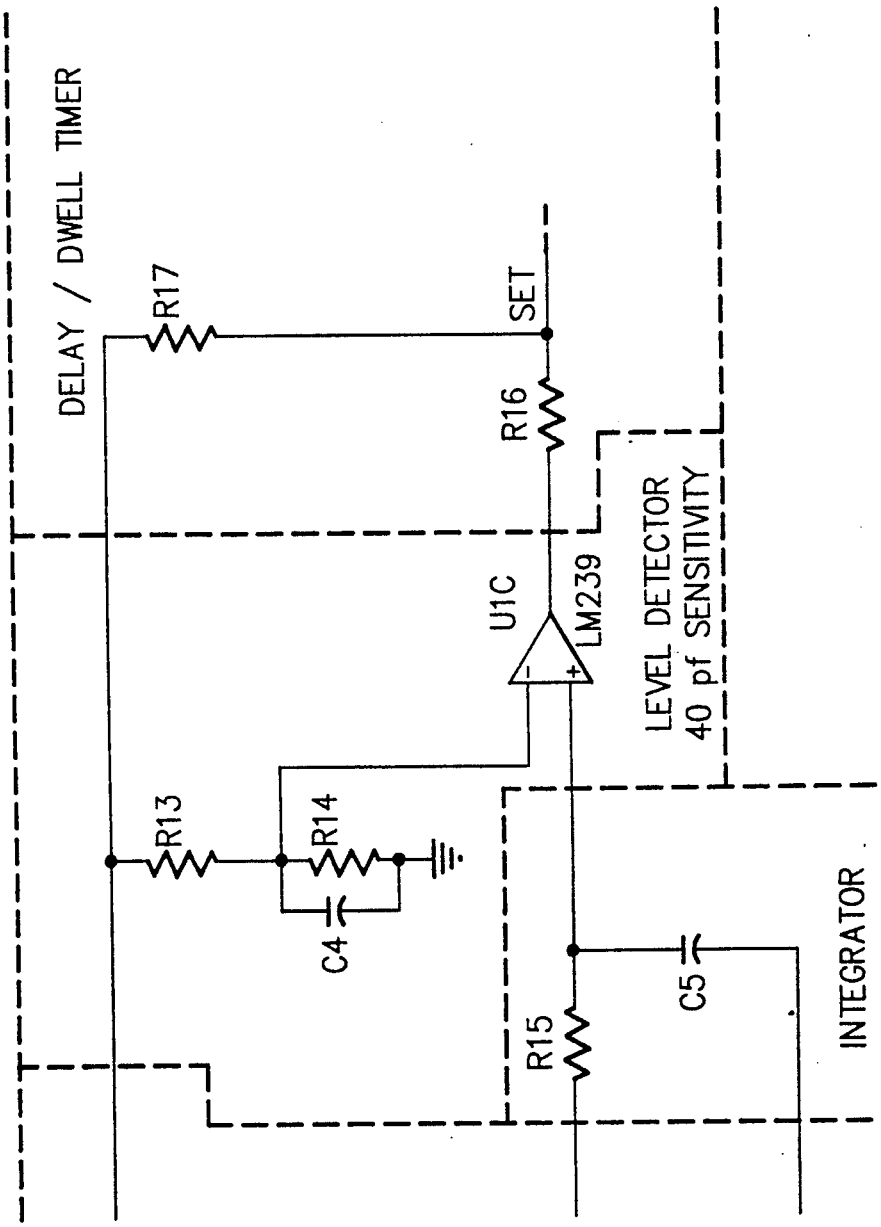
FIGS. 3A & 3B are interconnected schematic diagrams of an alternate, exemplary circuit for the button system of the present invention with constant pressure characteristics, with the two schematics being connected in the "Delay/Dwell Timer" block at the "SET" line.
Figure 3B:
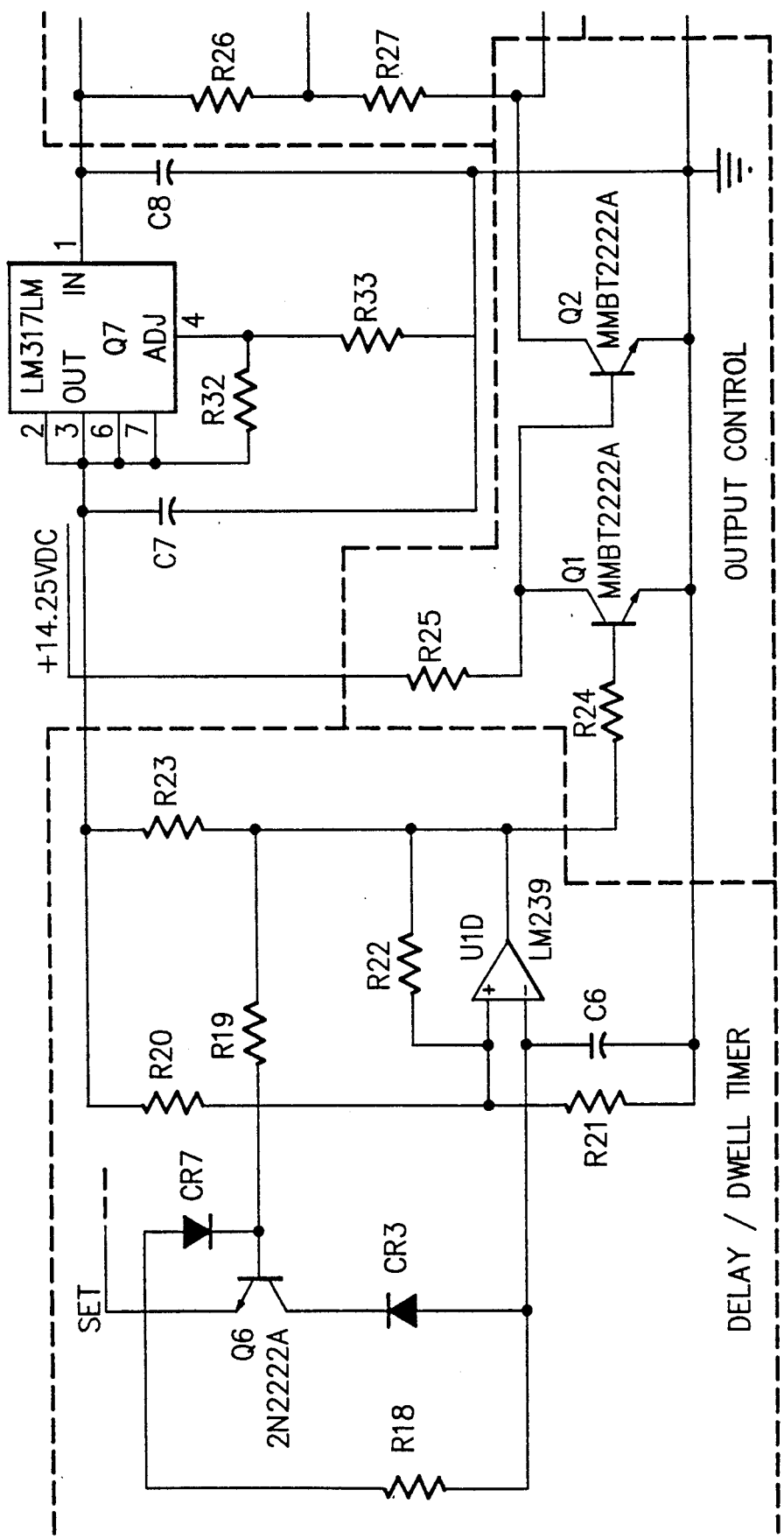
Figure 3B:
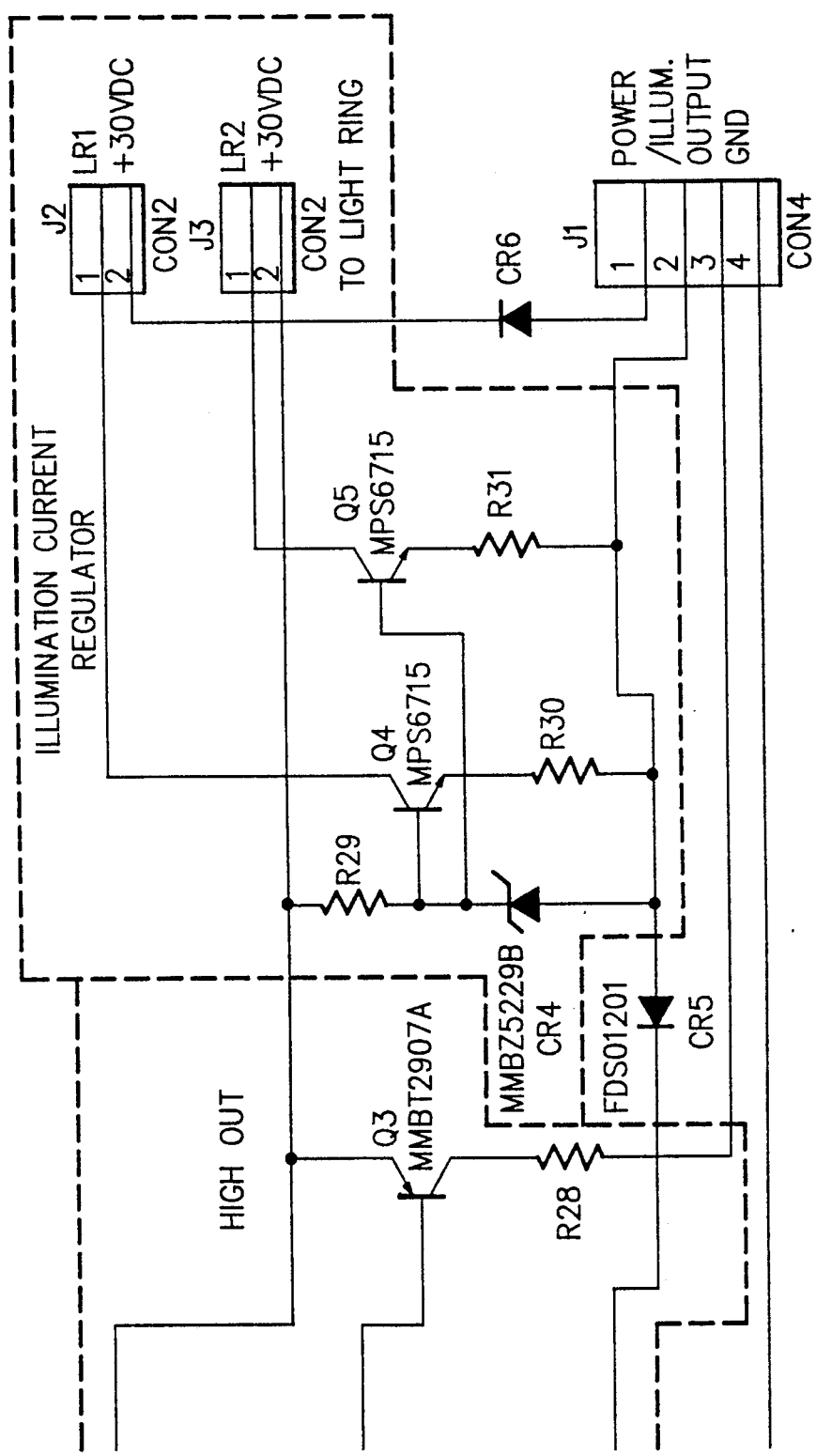
Figure 3B:
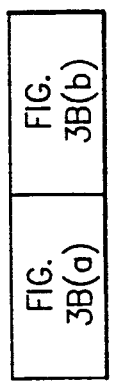

There are two basic exemplary embodiments of the present invention, a pure "constant pressure" solid state button (CPSSB) embodiment, schematically illustrated in detail in FIGS. 3A & 3B, and a related predecessor embodiment, the "auto balancing" solid state button (ABSSB), schematically illustrated in detail in FIGS. 2A & 2B.

The primary difference between the "constant pressure" solid state button (CPSSB) and the "auto balancing" solid state button (ABSSB) is that the ABSSB has an auto balancing feature. As generally noted above, the purpose of the auto balancing feature is to automatically accommodate for static changes in components, packaging and the environment, while maintaining a relatively high sensitivity to sensing when the button actually has been actuated. Due to the basic operation of auto balancing, the ABSSB is not a pure, "constant pressure" type button and, in the exemplary application of an elevator system, is not applied to, for example, "door open," "door close" and other applications requiring a pure constant pressure (CP) feature. In contrast the CPSSB module can be used, if desired, for all applications in the elevator system except the alarm button, which has special requirements.

THEORY OF OPERATION

If a button touch is constantly maintained for, for example, one hundred (100 msec.) milliseconds, the button module 10 will turn "on" its output and illumination long enough to be read and controlled by the operational control system without loss of the call or illumination. The illumination input preferably is controlled by the operational control system.

The ABSSB is reset upon the removal of the illumination control input. The illumination control of the CPSSB can also be used as an output when applied to other systems.

CIRCUIT DESCRIPTION

The basic functions for each embodiment (CPSSB & ABSSB) are as follows:

| (CPSSB) Auto-Balance (ABSSB) | Constant Pressure |
|---|---|
| Power | Power |
| Oscillator | Oscillator |
| PhaseShiftToPulseWidth | PhaseShiftToPulseWidth |

-continued

| (CPSSB) | Auto-Balance (ABSSB) | Constant Pressure |
|---|---|---|
| | Converter | Converter |
| | Integrators | Integrators |
| | Set&Reset Comparators | Level Detector |
| | Electrostatic Discharge (ESD) Protection | Electrostatic Discharge (ESD) Protection |
| | Delay on Timer | Delay/Dwell Timer |
| | Dwell on Timer | |
| | Output Control | Output Control |
| | High Out | High Out |
| | Illumination Current Regulator | Illumination Current Regulator |
| | PowerUp & Control System Reset Functions | |

FIGS. 2A & 2B and 3A & 3B are schematics of the "auto balance" embodiment and the "constant pressure" embodiments, respectively, with these functions outlined in block form.

POWER

The power aspects of the two embodiments represent standard approaches and their operation (and many alternatives thereto) are known to those of ordinary skill.

OSCILLATOR

The oscillator generates, for example, a square wave of an appropriate cycle. The threshold voltage to the non-inverting input of comparator U1A is set by resistors R2 & R3, and the state of the output of U1A, which controls the hysteresis resistor R4. The "on" state threshold is higher than the "off" state threshold.

The oscillator is controlled by the charging and discharging of capacitor C1. When comparator U1A is in the "on" state, capacitor C1 will charge to the "on" state threshold, and, as a result, the comparator will turn "off." Conversely, when comparator U1A is in the "off" state, capacitor C1 will discharge to the "off" state threshold, and, as a result, the comparator will turn "on."

This is standard oscillator circuitry, and its operation and various alternatives are known to those of ordinary skill.

PHASE SHIFT TO PULSE WIDTH CONVERTER

Auto Balance SSB

The phase shift to pulse width converter functions as follows. The oscillator is fed directly into the non-inverting input of U1C. When the oscillator is high, the output of U1C is released, providing the rising edge of the pulse. The inverting input of U1B monitors the phase shift of the oscillator through resistor R7 across the button input impedance. (The factors which contribute to the button input impedance are the capacitor C3, the ESD protection circuit and what is applied to or acquired by the button face.)

When the voltage at the inverting input of U1B reaches the threshold voltage on the non-inverting input, the output of U1B is pulled to common, at the falling edge of the pulse.

There is always a pulse, even without anything applied to the button face 1. The pulse is due tO the impedance of capacitor C3, the ESD protection circuit and any residuals in the circuit.

Capacitor C3 is used to prevent any DC voltage from being placed on the button face. The value of the capacitor C3 should be significantly larger than the capacitive sensitivity to be obtained.

The larger the value of the resistor R7, the larger the phase shift is for a given input impedance, including the effects of resistance and noise. The value of the resistor R7 preferably is chosen to generate as large a phase shift as possible from the input.

Constant Pressure SSB

Functions on the CPSSB preferably are combined and condensed to reduce the number of required components. The function of U1C, R45, and R46 in the "Phase Shift To Pulse Width Converter" block of the ABSSB can be condensed by, for example, replacing them with the diode CR2 on the CPSSB for its "Phase Shift To Pulse Width Converter" block. The functional performance of the pulse width to phase shift converter remains the same.

INTEGRATORS

The integrators convert pulse into a DC voltage. The DC voltage is equal to the duty cycle of the pulse multiplied by "Vcc," the regulated supply voltage.

Auto Balance SSB

The pulse from the "phase shift to pulse width converter" is fed into three different R-C integrators. Each integrator has a different time constant, providing relatively "slow" ($R13 \times C4$), "medium" ($R14//R16 \times C5$) and "fast" ($R15 \times C6$) time constants. The "medium" integrator has a resistor (R16) in parallel with its capacitor to act as a voltage divider. The voltage divider insures that the steady state DC voltage of the "medium" integrator will be less than that of the "slow" and "fast" integrators.

The three integrators of FIG. 2A provide the auto balancing feature of the invention. The "medium" speed integrator provides the "trigger" signal, while the "slow" and "fast" integrators provide the "set" and "reset" thresholds.

The selection criteria for the integrator time constants is given below.

Constant Pressure SSB

In contrast, since the deletion of the auto balance feature is part of the purpose of the CPSSB, only one integrator is required for the CPSSB (FIG. 3A).

SET AND RESET COMPARATORS AND LEVEL DETECTORS

Auto Balance SSB Set and Reset Comparators

The purpose of the set comparator (U2A) is to provide a set pulse resulting from an increase in the pulse width from the "phase shift to pulse width converter." A set pulse is defined as a continuous release, from common, of the set comparator's output for any duration of time. The set comparator will release its open collector output, whenever the DC level of the "medium" integrator is greater than the DC level of the "slow" integrator.

The purpose of the reset comparator (U2B) is to provide a "reset" pulse resulting from a decrease in the "phase shift of the pulse width converter's" pulse width. A "reset" pulse is defined as a continuous pull to common of the reset comparator's output for any duration. The reset comparator will pull its open collector output to common, whenever the DC level of the "fast"

integrator is less than the DC level of the "medium" integrator.

The "slow" integrator time preferably is set as slow as required, in order to maintain the required time constant differences between the integrators and minimize the ripple voltage of the "fast" integrator.

The "medium" integrator time constant and voltage divider preferably is chosen to obtain a "set" pulse with a duration equal to the delay "on" time.

The "fast" integrator's time constant preferably is chosen to obtain a "reset" pulse upon the removal of a minimal input A minimal input is defined as the smallest amount of impedance which could cause a set pulse.

Exemplary values for the "Integrators" block is set out below:

| Component | Value |
| --- | --- |
| R13 | 200KΩ |
| R14 | 100KΩ |
| R15 | 100KΩ |
| C4 | 1 μF |
| C5 | 0.68 μF |
| C6 | 0.047 μF |

Constant Pressure SSB Level Detector

The purpose of the level detector is to activate the button as long as the voltage on the integrator exceeds the fixed threshold. The integrator voltage being compared to a fixed threshold is what makes this a constant pressure (CP) device.

Several factors contribute to the setting of the threshold set by the resistors R13 and R14. The threshold is set to allow for component tolerance variations within the specified working temperature range. The sensitivity of the button set by the threshold may be set to, for example, forty (40 pF) picofarads with nominal component values and should be no less than the projected "worst case" scenario.

ELECTROSTATIC DISCHARGE (ESD) PROTECTION

The primary part of the electrostatic (ESD) protection circuit is the spark gap SG1. In the event of an ESD the spark gap will activate and provide a low impedance path to earth via connector J4-1.

Connector J4-1 preferably is connected to the face plate of the button with a short wire. In hall fixture applications the face plate should be connected to the masonry box with, for example, an insulated flat braided conductor. The masonry box in turn should be bonded to building steel through wiring conduit or a flat braided conductor to the closest building steel.

The spark gap is a relatively slow device, and, therefore, the zener diode CR1 is used to limit any incoming voltage to, for example, thirty volts (30 V). The purpose of resistor R1 is to limit the current through the zener diode CR1 and absorb the major portion of the energy.

Resistor R1 may be selected to be of carbon composition due to their pulse energy handling capability and size. On the auto balance SSB the printed circuit (PC) board is conformably coated to prevent uncontrolled arching on the PC board during an ESD.

On the constant pressure SSB connector J4 may be a separate connector from J1 to maintain, for example, a quarter inch (0.25") spacing between the chassis ground and the rest of the circuit. The relatively large spacing is required to prevent uncontrolled arcing on the PC board during an ESD. During an ESD the potential of J4 will rise due to the very high frequency components of the ESD and the inductance of the chassis ground lead.

Appropriate spacing is also required from the button connection to the button face. The electrical connection to the button face can be achieved with, for example, appropriate wire soldered into the PC board and a ring terminal to the intermediate button stem or interconnecting bolt 7 (note FIG. 1), which bolt holds and electrically connects the button face and the PC board.

AUTO BALANCE SSB DELAY ON TIMER

In accordance with the invention the purpose of the delay on the timer is for erroneous signal rejection. As generally discussed above, the erroneous signals of primary concern are those which could be caused by heat or other like extreme environmental changes. Testing has shown that any set pulses caused by extreme environmental changes typically do not last longer than one hundred (100 msec.) milliseconds with an input resistance (R7) of, for example, one (1 MΩ) megohms.

Further testing with the resistor R7 set to, for example, two hundred and sixty-one (261 kΩ) kilo-ohms resulted without any set pulses caused by extreme environmental change. From these results a delay "on" time of, for example, one hundred (100) milliseconds is deemed to be more than adequate for exemplary purposes.

The delay time may be achieved by a set pulse charging capacitor C8 through resistors R17, R18 and diode CR2 to a threshold set by resistors R20 and R21. The voltage across capacitor C8 will reach the threshold, if a set pulse or series of set pulses transpire without the occurrence of any "reset" pulses.

Once the threshold is reached, the output of comparator U2C is released from common. The voltage on capacitor C8 is pulled up and held high by hysteresis resistor R22, pending the occurrence of a "reset" pulse.

At any time the voltage across C8 can be quickly discharged by a "reset" pulse. The voltage across capacitor C8 is discharged through the current limiting resistor R19, which resets the timer.

AUTO BALANCE SSB DWELL ON TIMER

The purpose of the dwell "on" time is to insure that, once an input to the button face has activated the button, a call will be registered regardless of subsequent changes to the input.

When the output of U20 is released from common, the capacitor C9 is quickly charged through R23 and CR3. Once the voltage across the capacitor C9 reaches the "inactive" threshold, the output of comparator U2D is pulled to common. When the output of U2D is pulled to common, the button is activated. The threshold voltage to the non-inverting input of comparator U2D is set by resistors R24 & R25 and the state of the output of U2D, which controls the hysteresis resistor R27.

The dwell "on" time begins when the input to the button face is removed, and, as a result, the output of U2C is pulled to common. The voltage across the capacitor C9 is discharged through resistor R26, providing the dwell "on" time. Once the voltage across the capacitor C9 reaches the "active" threshold, the output of comparator U2D is released from common, deactivating the output control.

Resistor R16 limits the discharge current to protect the output of U1C. Resistors R17 and R16 create a Voltage divider to which capacitor C6 will discharge. Resistor R17 was selected to set the voltage of the divider lower than the "active" threshold voltage.

Diode CR7 protects Q6 by limiting the emitter to base voltage. When the output of comparator U1C is released and comparator U1D is pulled to common, a voltage divider is created by R17, CR7, and R19. This voltage divider sets the voltage on the capacitor C6, while the button 1 is being held in the active state. The difference between the voltage divider and the "active" threshold level provides the "dv" or difference in voltage for the dwell time.

Diode CR3 prevents leakage current through transistor Q6, which would decrease the delay on time provided by the charging of the capacitor C6.

CONSTANT PRESSURE SSB DELAY/DWELL TIMER

The delay/dwell of the CPSSB timer combines the purposes and functions of the ABSSB's delay and dwell timers.

The delay "on" time is initiated upon the release of the level detector's output from common, allowing capacitor C6 to charge through resistor R17. Once the voltage on C6 reaches the "inactive" threshold the output of comparator U1D is pulled to common, activating the output control. The threshold voltage to the non-inverting input of comparator U1D is set by resistors R20 & R21 and the state of the output of U2D which controls the hysteresis resistor R22. The time required to charge C6 provides the delay "on" time.

If the input tot he button face is removed prior to the output of U1D being pulled to common the delay "on" time will be quickly reset. As a result of the input to the button face being removed the output of U1C is pulled to common, providing a discharge path for C6 via CR3, Q6 and R16. Since the output of U1D is not pulled to common, transistor Q6 will be active during the discharge of capacitor C6. The activation of transistor Q6 effectively removes resistor R1B from the discharge path of C6, allowing the delay "on" time to be quickly reset.

The dwell "on" time begins when the input to the button face is removed after the output of U1D is pulled to common. The voltage across capacitor C6 is discharged through resistors R16 and R18, providing the dwell "on" time. Once the voltage across C6 reaches the "active" threshold the output of comparator U2D is released from common, deactivating the output control.

Resistor R16 limits the discharge current to protect the output of U1C. Resistors R17 & R16 create a voltage divider to which the capacitor C6 will discharge. Resistor R17 was selected to set the voltage of the divider lower than the "active" threshold voltage.

Diode CR7 protects transistor Q6 by limiting the emitter-to-base voltage. When the output of U1C is released and U1D is pulled to common, a voltage divider is created by resistor R17, diode CR7 and resistor R19. This voltage divider sets the voltage on capacitor C6, while the button is being held in the active state. The difference between the voltage divider and the "active" threshold level provides the "dv" for the dwell time.

Diode CR3 prevents leakage current through Q6, which would decrease the delay "on" time provided by the charging of capacitor C6.

OUTPUT CONTROL

The output control provides the active pull to common required by the "high out" and "illumination current regulator" functions.

Transistor Q1 of the output control provides the signal inversion required between the output of comparator U2D and the output driving transistor Q2.

Transistor Q2 was chosen to have the current rating required to drive the "high out" and "illumination current regulator" functions.

HIGH OUT

The button assembly 10 is designed to interface to a remote station module in an elevator system. The output to the module is required to be an active high level. The high level is provided through resistor R40, when the transistor Q3 is driven into saturation by transistor Q2, pulling resistor R39 to common.

Resistor R40 is a current limiting resistor, which protects the transistor Q3 in the case of an accidental shorting of the output to ground.

ILLUMINATION CURRENT REGULATOR

The illumination is controlled by the button 1 through transistor Q2 or the module through connector J1-2. The illumination is comprised, for example, of two external strings of LEDs being fed by dedicated current regulators through connectors J2 and J3. The current through each string is regulated to, for example, thirty (30 mA) milliamps, by controlling the voltage across the resistors R42 and R43 with zener diode CR7.

The value of resistor R41 was selected to provide the proper current dependent voltage across diode CR7.

The signal diode CR8 is used to isolate the high level output from the illumination control of the remote station module. This isolation allows the operational controller to be signaled, when the button is released.

Due to the minimum input voltage requirement of, for example, twenty and four-tenths volts DC (20.4 VDC) the nine light ring LEDs were divided into two strings.

POWER UP AND CONTROL SYSTEM RESET FUNCTIONS

The power up reset insures that the button does not activate due to power outages of arbitrary duration. Upon the application of power, capacitor C10 will charge at a rate set by the resistors R31 and R32 to a threshold set by resistors R33 and R34. The output of comparator U1D is pulled to common, while the capacitor C10 is charging. The output of the comparator U1D being pulled to common prevents the capacitor C8 from charging, while the integrators charge to their steady state levels.

The purpose of diode CR4 is to quickly discharge the capacitor C10 in the event of short power outages.

A system reset is provided due to the remote possibility that noise could activate and latch the button 1. Under normal operation the button 1, when activated, will provide a high output to its remote station.

The operational control system will read in and acknowledge the call by turning on the appropriate remote station output. The output will pull the "/ILLUM." input to common, turning "on" the illumination.

Once the elevator arrives at the floor, the control system typically will check the button output to see if a person is trying to hold the doors open with the call button. If the button output is active, the control system will hold the doors open and leave the button's illumination on. In the event the button is latched active or the person "fell asleep," the operational control system could remove its pull to common on the "/ILLUM." input, turning the illumination "off" and providing a reset.

When the "/ILLUM." input is pulled to common, the bias across capacitor C11 is reversed. The capacitor C11 will discharge through diodes CR5 and CR6 and current limiting resistor R36.

After discharging, the capacitor C11 will be charged to a voltage set by resistors R33 and R34. When the "/ILLUM." input pull to common is removed, the charge across the capacitor C11 will temporarily increase the voltage to the inverting input of comparator U1D. While the voltage of the non-inverting input is greater than the threshold set by resistors R31 and R32, the output of comparator U1D will be pulled to common discharging the capacitor C8.

Diode CR6 is used to prevent the voltage to the non-inverting input of the comparator U1D from going too far below common, when the bias on the capacitor C11 is reversed.

Diode CR6 is used to prevent any current from flowing through resistor R35 from the "Illumination Current Regulator" function.

Diode CR9 is used to isolate the reset function from the Output Control.

CIRCUITRY DETAILS

Of course the circuits shown and described are exemplary and subject to great variation. The specific values of each of the resistors, capacitors and diodes are not key to the invention and many workable values of them are available and known to those of ordinary skill.

The exemplary solid state button assembly described in detail above is designed to be applied in a hall fixture and car operating panel (COP) of an elevator, although, of course, many other uses and applications are possible. The exemplary unit described is a low cost, easily replaceable device, taking, for example, five (5) minutes to replace.

Although this invention has been shown and described with respect to detailed, exemplary embodiments thereof, it should be understood by those skilled in the art that various changes in form, detail, methodology and/or approach may be made without departing from the spirit and scope of this invention.

Having thus described two exemplary embodiments of the invention, that which is new and desired to be secured by Letters Patent is claimed below.

We claim:

1. A capacitive sensing touch button for controlling a function, said button comprising:
   a button surface for receiving a reference signal, said button surface outputting a signal shifted in phase, relative to the reference signal, upon contact of said button surface by a user;
   an oscillator, operatively connected to said button surface, to provide the reference signal to said button surface, said oscillator having a predetermined duty cycle;
   phase shift to pulse width converter, operatively connected to said button surface and said oscillator, to convert the phase-shifted signal into a pulse width based on the amount of the phase shift relative to the reference signal;
   auto-balancing compensation, operatively connected to said phase shift to pulse width converter, including at least two integrators, each having a different time constant, each of said integrators receiving the pulse widths and converting the pulse width into a dc voltage, said auto-balancing compensation outputting either a SET signal or a RESET signal based on the relative dc voltage values produced by said integrators, thereby avoiding false activation of the controlled function due to residual impedance and/or external influences at said button surface; and
   delay-on circuitry, operatively connected to said auto-balancing compensation, to receive the signal output therefrom, said delay-on circuitry generating a control signal to control the controlled function provided that said SET signal is present at least a predetermined time period, thereby avoiding false activation of the controlled function due to transient noise.

2. The capacitive sensing touch button of claim 1, wherein:
   said auto-balancing compensation includes three integrators, a first integrator having a relatively slow time constant, a third integrator having a relatively fast time constant, and a second integrator having a time constant between the first and second time constants, each of said integrators receiving the pulse width and converting the pulse width into a dc voltage;
   said auto-balancing compensation outputting the SET signal when the voltage output from said second integrator is greater than the voltage output from said first integrator; and
   said auto-balancing compensation outputting the RESET signal when the voltage output from said third integrator is less than the voltage output from said second integrator.

3. The capacitive sensing touch button of claim 1, said touch button further including electrostatic discharge protection circuitry operatively connected between said button surface and said phase shift to pulse width converter, said protection circuitry comprising:
   a spark gap connected between said button surface and a first grounding path;
   a resistor having a first terminal connected to said button surface and a second terminal connected to said phase shift to pulse width converter; and
   a Zener diode connected between said second terminal of said resistor and a second grounding path, wherein said first and said second grounding paths are separate.

4. A capacitive sensing touch button for controlling a function, said button comprising:
   a button surface for receiving a reference signal, said button surface outputting a signal shifted in phase, relative to the reference signal, upon contact of said button surface by a user;
   an oscillator to provide the reference signal to said button surface, said oscillator having a predetermined duty cycle;
   phase shift to pulse width converter to convert the phase-shifted signal into a pulse width based on the amount of the phase shift relative to the reference signal;

an integrator to convert the pulse width into a dc voltage;

a level detector to output a control signal when the dc voltage is greater than a predetermined threshold voltage; and a delay/dwell timer to receive said control signal and to control the controlled function provided that said control signal is present at least a predetermined time period, thereby avoiding false activation of the controlled function due to transient noise.

5. The capacitive sensing touch button of claim 4, said touch button further including electrostatic discharge protection circuitry operatively connected between said button surface and said phase shift to pulse width converter, said protection circuitry comprising:

a spark gap connected between said button surface and a first grounding path;

a resistor having a first terminal connected to said button surface and a second terminal connected to said phase shift to pulse width converter; and a Zener diode connected between said second terminal of said resistor and a second grounding path, wherein said first and said second grounding paths are separate.

6. The capacitive sensing touch button of claim 4, wherein said phase shift to pulse width converter comprises a diode.

7. The capacitive sensing touch button of claim 4 wherein said delay/dwell timer comprises:

a transistor having an emitter operatively connected to said control signal;

a first resistor and first diode in series connection between said emitter and the collector of said transistor, wherein said first diode's cathode is connected to said collector;

a second diode having an anode and a cathode operatively connected between said emitter and the base, respectively, of said transistor; and a comparator having a first input operatively connected to said anode of said first diode, said first input further operatively connected ground via a first capacitor, and a second input operatively connected to an RC network having a predetermined time constant, wherein the output of said comparator controls the controlled function, provided that said control signal is present at least a predetermined time period, wherein said predetermined time period is based on said time constant.

* * * * *

UNITED STATES PATENT AND TRADEMARK OFFICE
CERTIFICATE OF CORRECTION

PATENT NO. : 5,036,321

DATED : July 30, 1991

INVENTOR(S) : ROBERT B. LEACH, ET AL

It is certified that error appears in the above-identified patent and that said Letters Patent is hereby corrected as shown below:

In Column 1, line 48, after the word "shifts" please insert --.--.

In Column 3, line 42, please delete "DESCRIPTION OF THE PREFERRED EMBODIMENT" and insert --BEST MODE FOR CARRYING OUT THE INVENTION-- in lieu thereof.

In Column 4, line 6, please delete ""U'8" and insert --"U"-- in lieu thereof.

In Column 5, line 64, please delete "tO" and insert --to-- in lieu thereof.

In Column 7, line 12, after the word "input" please insert --.--;

Column, line 43, after the word "electrostatic", please insert the word --discharge--.

In Column 8, line 52, please delete "U20" and insert --U2C-- in lieu thereof.

In Column 9, line 3, please delete the word "Voltage" and insert --voltage-- in lieu thereof;

UNITED STATES PATENT AND TRADEMARK OFFICE
CERTIFICATE OF CORRECTION

PATENT NO. : 5,036,321

DATED : July 30, 1991

INVENTOR(S) : Robert B. LEACH, ET AL

It is certified that error appears in the above-identified patent and that said Letters Patent is hereby corrected as shown below:

Column, line 42, please delete "R1B" and insert --R18-- in lieu thereof.

In Column 12, line 7, please delete the word "widths" and insert the word --width-- in lieu thereof.

Signed and Sealed this

Sixteenth Day of February, 1993

Attest:

STEPHEN G. KUNIN

Attesting Officer

Acting Commissioner of Patents and Trademarks